US007180996B2

(12) United States Patent
Ishikawa et al.

(10) Patent No.: US 7,180,996 B2
(45) Date of Patent: Feb. 20, 2007

(54) CARD SYSTEM

(75) Inventors: Yasuhiro Ishikawa, Kanagawa (JP); Masashi Seto, Kanagawa (JP)

(73) Assignee: Union Machinery Co., Ltd., Kanagawa (JP)

( * ) Notice: Subject to any disclaimer, the term of this patent is extended or adjusted under 35 U.S.C. 154(b) by 0 days.

(21) Appl. No.: 11/014,774

(22) Filed: Dec. 20, 2004

(65) Prior Publication Data

US 2005/0280600 A1 Dec. 22, 2005

(30) Foreign Application Priority Data

May 11, 2004 (JP) ............................ 2004-140814

(51) Int. Cl.
*H04M 3/00* (2006.01)
*H05K 7/10* (2006.01)

(52) U.S. Cl. .................. 379/357.01; 361/683; 361/684

(58) Field of Classification Search ................ 343/906; 361/686, 683; 379/357.01
See application file for complete search history.

(56) References Cited

U.S. PATENT DOCUMENTS 5,680,144 A * 10/1997 Sanad ................. 343/700 MS
5,954,521 A * 9/1999 Yang ........................... 439/59
2002/0052219 A1* 5/2002 Hamamura ................. 455/557
2002/0118508 A1* 8/2002 Paredes et al. ............. 361/686
2003/0011524 A1* 1/2003 Beard et al. ................ 343/702
2003/0075604 A1* 4/2003 Fuji et al. .................... 235/451
2003/0128167 A1* 7/2003 Beard et al. ................ 343/702
2005/0052836 A1* 3/2005 Bhogal ....................... 361/683

FOREIGN PATENT DOCUMENTS

JP 2003-298897 10/2003

OTHER PUBLICATIONS

English Language Abstract of JP 2003-298897.

* cited by examiner

*Primary Examiner*—Don Wong
*Assistant Examiner*—Angela M Lie
(74) *Attorney, Agent, or Firm*—Greenblum & Bernstein, P.L.C.

(57) ABSTRACT

A card system according to the present invention comprises a card connector 10, which is provided in an electronic device, a wireless communication card 20, which is inserted removably into the card connector 10, and an antenna unit, which is provided in the electronic device and connected electrically to the card connector 10. In the card system, the card connector 10 comprises connector-side device terminals 12, which are connected electrically to the electronic device, and a connector-side antenna terminal 13, which is connected electrically to the antenna unit. Accordingly, the wireless communication card 20 comprises card-side device terminals 22 and a card-side antenna terminal 23, which are connected electrically with the connector-side device terminals 12 and with the connector-side antenna terminal 13, respectively, when the wireless communication card 20 is inserted into the card connector 10.

9 Claims, 5 Drawing Sheets

CARD SYSTEM

RELATED APPLICATIONS

This application claims the priority of Japanese Patent Application No. 2004-140814 filed May 11, 2004, which is incorporated herein by reference.

FIELD OF THE INVENTION

The present invention relates to a card system that comprises a card connector, which is provided in an electronic device, and a wireless communication card, which is insertable into the card connector.

BACKGROUND OF THE INVENTION

Antenna-equipped cards such as wireless LAN cards and data communication cards used in portable telephone systems have been in practical use for wireless data communications. An antenna-equipped card, which enables a personal computer, a Personal Digital Assistant (PDA), a digital camera or the like to communicate wirelessly with an external electronic device, has a communication controller, which executes modulation for data being sent to the external device and demodulation for data being received from the external device.

For example, as shown in FIG. 5, an antenna-equipped card 105 used with a digital camera 101 comprises an antenna unit 106, which extrudes along a side of the card 105. The card 105 itself is inserted removably into a card connector (card slot) 102, which is provided in the digital camera 101. Image data of photos taken by the digital camera 101 are sent through the antenna unit 106 of the antenna-equipped card 105 to an external device, for example, a printer. There is also another type of antenna-equipped card 110 whose antenna is miniaturized (for example, refer to Japanese Laid-Open Patent Publication No. 2003-298897).

However, when an antenna-equipped card is inserted into the card connector of an electronic device, for example, a digital camera, the antenna unit of the card is positioned to protrude from the main body of the device. For the operation of the device, this protrusion is an obstruction, which can be caught accidentally by another object. If such an accident happens, then the antenna unit may be damaged or pulled unintentionally and detached electrically, disrupting the data communication. Also, the protrusion of the antenna unit of a card from the main body of a device can be a disfigurement to the exterior appearance of the device.

SUMMARY OF THE INVENTION

It is an object of the present invention to provide a card system that enables wireless data communication without disfiguring a device, to which the system is applied.

To achieve this objective, a card system according to the present invention comprises a card connector, which is provided in an electronic device (for example, the digital camera 1 described in the following embodiment), a wireless communication card, which is inserted removably into the card connector and controls wireless data communication between the electronic device and a device external to the electronic device, and an antenna unit, which is provided in the electronic device and is connected electrically to the card connector. In the card system, the card connector comprises connector-side device terminals, which are connected electrically to the electronic device, and a connector-side antenna terminal, which is connected electrically to the antenna unit. Accordingly, the wireless communication card comprises card-side device terminals, which are connected electrically with the connector-side device terminals when the wireless communication card is inserted in the card connector, and a card-side antenna terminal, which is connected electrically with the connector-side antenna terminal when the wireless communication card is inserted in the card connector. With the wireless communication card set in the card connector, the card system can send data from the electronic device through the wireless communication card and the antenna unit.

In the above described card system according to the present invention, it is preferable that the wireless communication card be internalized in the electronic device when it is inserted into the card connector.

Furthermore, in the above described card system, it is preferable that the card-side device terminals be provided in the front end of the wireless communication card in the direction of insertion and that the connector-side device terminals be provided in the surface of the card connector facing the card-side device terminals.

Moreover, preferably, the card system be constructed such that the card connector can accept insertion of a memory card. In this case, the memory card comprises card-side device terminals, which are connected electrically with the connector-side device terminals when the memory card is inserted in the card connector. With the memory card set in the card connector, the card system enables data communication between the electronic device and the memory card through the connector-side device terminals and the card-side device terminals of the memory card.

According to the present invention, with the wireless communication card set in the card connector, data from the electronic device are sent through the wireless communication card and the antenna unit, which is provided in the electronic device. In the card system, which achieves wireless data communication, the wireless communication card, which is inserted in the card connector, does not disfigure the external appearance of the device and does not obstruct the operation of the device.

The card system according to the present invention is designed to internalize the wireless communication card in the electronic device when the wireless communication card is inserted in the card connector. Therefore, the insertion of the wireless communication card never results in a disfigurement to the external appearance of the device or in an obstruction to the operation of the device.

Furthermore, in the card system where the card-side device terminals are provided in the front end of the wireless communication card in the direction of insertion while the connector-side device terminals are provided in the surface of the card connector facing the card-side device terminals, the connector-side antenna terminal and the card-side antenna terminal are provided without any change to the arrangement of the connector-side device terminals and the card-side device terminals, which arrangement has been practiced in the prior art.

Additionally, by constructing the card system to accept a memory card in the card connector, data from the electronic device can be stored on the memory card.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below and the accompanying drawings which are given by way of illustration only and thus are not limitative of the present invention.

DESCRIPTION OF THE PREFERRED EMBODIMENTS

Figure 1:
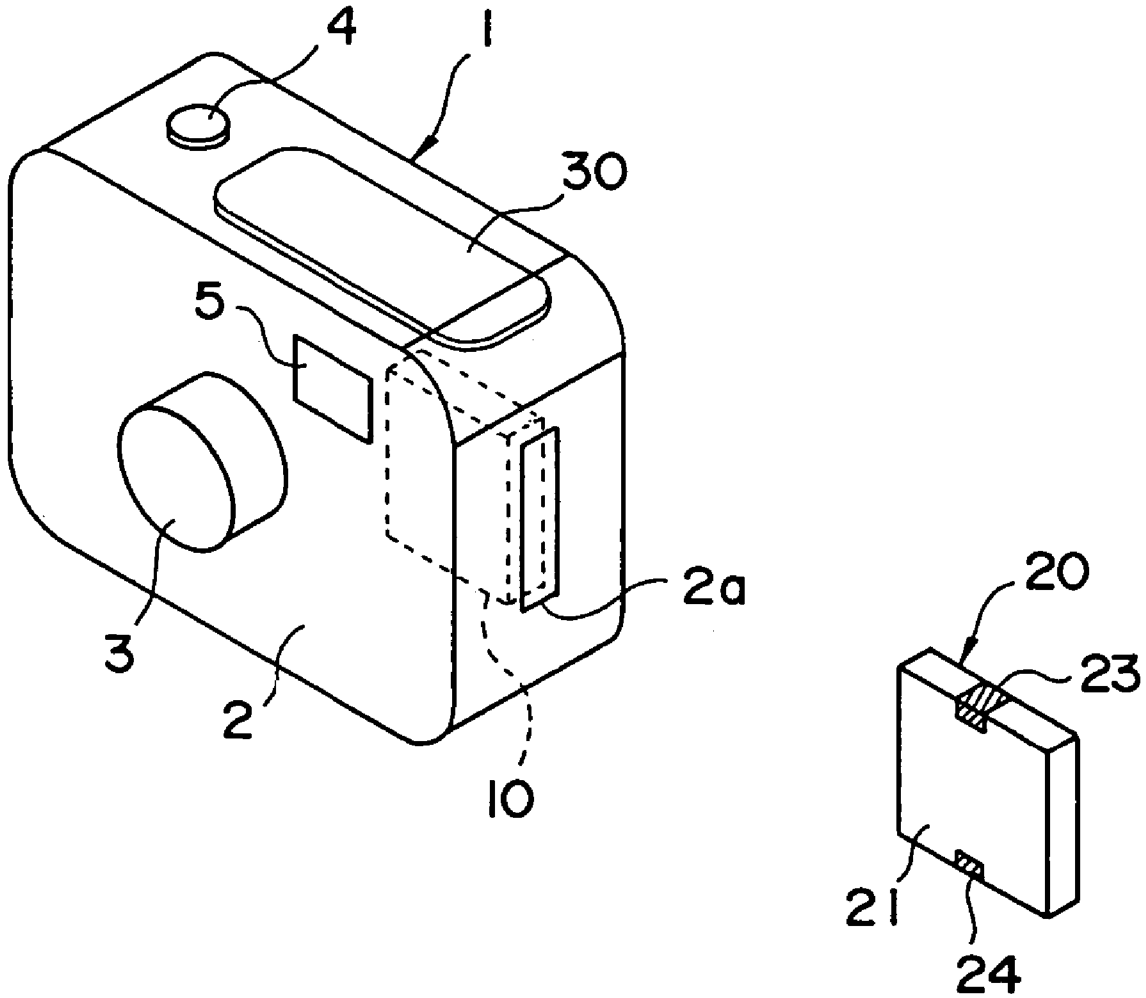
FIG. 1 is a perspective view of a digital camera, which is provided with a card system according to the present invention.

Now, preferred embodiments according to the present invention are described with reference to the drawings. FIG. 1 shows a digital camera 1, which is provided with a card system according to the present invention. The digital camera 1 comprises a camera body 2, a lens tube 3, which is located in front of the camera body 2, a release switch 4, which is provided on the upper face of the camera body 2, and a flash 5, which is provided in the upper front side of the camera body 2. In addition, a liquid-crystal display and various types of switches (not shown) are provided on the rear side of the camera body 2.

Furthermore, the camera body 2 comprises a card connector 10, which is provided internally. Into the card connector 10, a memory card (not shown) or a wireless communication card 20, which is detailed later, is inserted removably. Now, the card system, which comprises the card connector 10, is described. The card system comprises the above mentioned card connector 10, an antenna unit 30, which is connected electrically to the card connector 10, and the above mentioned wireless communication card 20, which controls the wireless data communication between the digital camera 1 and an external device.

Figure 2:
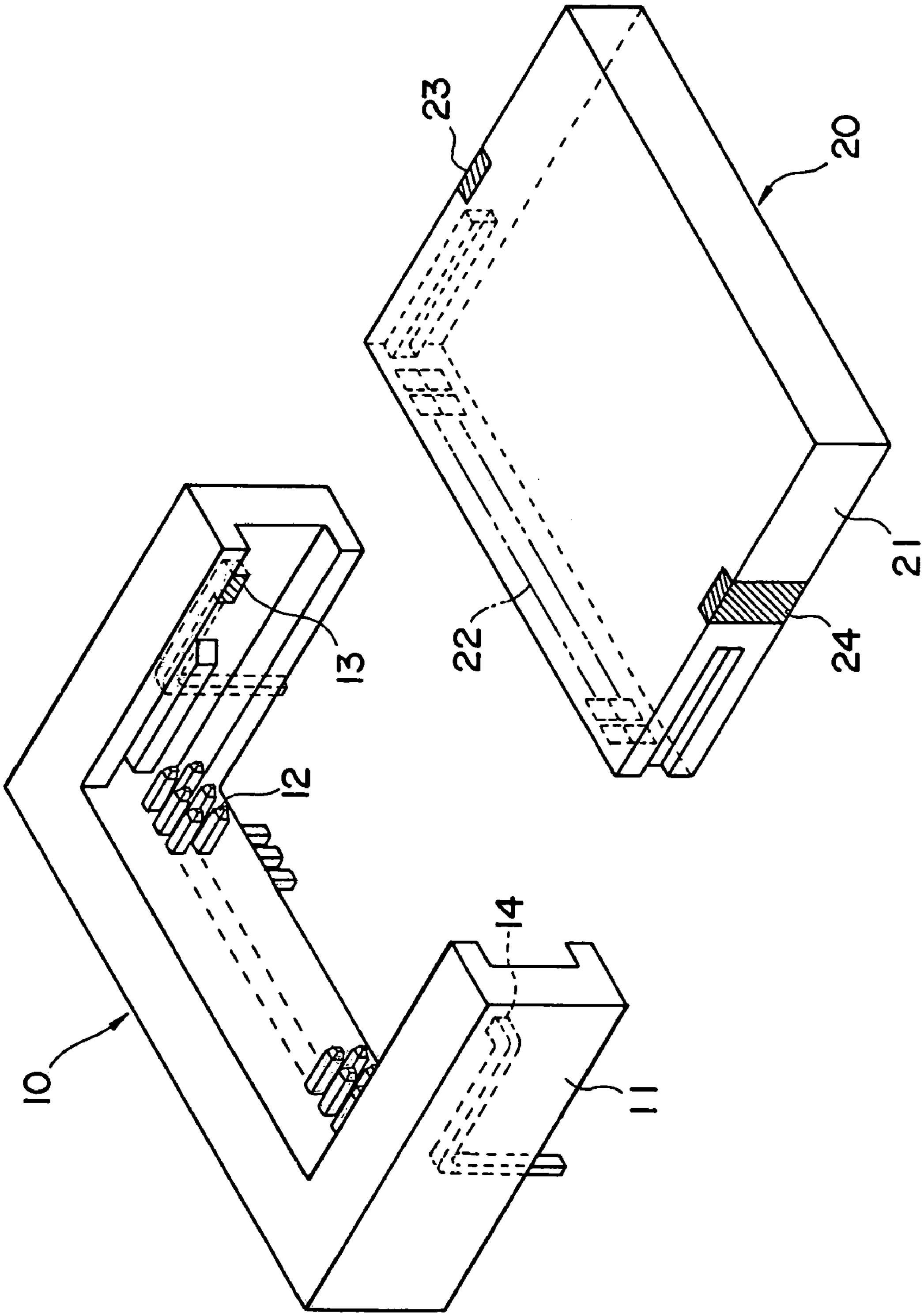
FIG. 2 is a perspective view of the card system.

As shown in FIG. 2, the card connector 10 comprises mainly a connector body 11, with which the wireless communication card 20 is brought fittingly into contact. The connector body 11 is positioned with respect to the card-insertion slot 2*a* and fixed in the right side of the camera body 2 as shown in FIG. 1. As shown in FIG. 2, in the surface of the connector body 11 facing the card-insertion slot 2*a*, i.e., the surface facing the front end of the wireless communication card 20 in the direction of the insertion, provided are a plurality of connector-side device terminals 12, which are connected electrically to the card interface unit (not shown) of the digital camera 1. The connector-side device terminals 12 are arranged to be connected electrically with the card-side device terminals 22 of the wireless communication card 20. The card interface unit is connected electrically to the image processing unit (not shown) of the digital camera 1, and image data processed by the image processing unit are output through the card interface unit (and the card connector 10) to an external device, which is connected electrically.

In one of the internal side faces of the connector body 11, provided is a connector-side antenna terminal 13, which is connected electrically to the antenna unit 30. The connector-side antenna terminal 13 is so positioned that the connector-side antenna terminal 13 is connected electrically to the card-side antenna terminal 23 of the wireless communication card 20, which is inserted in the card slot. Also, in the other of the internal side faces of the connector body 11, provided is a connector-side ground terminal 14, which is grounded electrically, and the connector-side ground terminal 14 is so positioned that the connector-side ground terminal 14 is connected electrically to the card-side ground terminal 24 of the wireless communication card 20, which is inserted in the card slot.

The antenna unit 30 comprises, for example, a film antenna, which enables wireless data communication with an external device, for example, a printer (not shown), and the antenna is provided in the upper part of the camera body 2. Instead of the film antenna, a chip-type antenna may be used as the antenna unit 30 in the camera body 2. The types of wireless communication executed through the antenna unit 30 are not limited to any specific protocol and include Personal Handyphone System (PHS), Bluetooth and the like.

The wireless communication card 20 comprises mainly a card body 21, which is brought into fitting connection with the connector body 11 when the card body 21 is inserted removably into the card connector 10. The wireless communication card 20 further comprises a communication control unit (not shown) to control the wireless data communication between the digital camera 1 and an external device. The communication control unit, which is provided in the card body 21, executes modulation for data being sent through the antenna unit 30 to an external device (not shown) and demodulation for data being received from an external device.

In the front end of the card body 21 in the insertion direction of the wireless communication card 20, provided are a plurality of card-side device terminals 22, which are connected electrically with the connector-side device terminals 12 when the wireless communication card 20 is inserted into the card connector 10. The connector-side device terminals 12 and the card-side device terminals 22 are pin-type (or bellows-type) terminals.

The above mentioned card-side antenna terminal 23 is provided in one of the side faces of the card body 21, so that the card-side antenna terminal 23 is connected electrically with the connector-side antenna terminal 13 when the wireless communication card 20 is inserted in the card connector 10. The card-side antenna terminal 23 is connected electrically to a communication control unit, which is provided in the card body 21. The connector-side antenna terminal 13 and the card-side antenna terminal 23 are surface contact (or multipolar contact) type terminals.

The above mentioned card-side ground terminal 24 is provided in the other of the side faces of the card body 21, so that the card-side ground terminal 24 is connected electrically with the connector-side ground terminal 14 when the wireless communication card 20 is inserted in the card connector 10. The card-side ground terminal 24 is connected electrically to the communication control unit, which is provided in the card body 21. The connector-side ground terminal 14 and the card-side ground terminal 24 are surface contact (or multipolar contact) type terminals.

As mentioned above, the card system is designed to enable insertion of a memory card (not shown) instead of the wireless communication card 20. In this case, the memory card comprises card-side device terminals (not shown), which are connected electrically with the connector-side device terminals 12 when the memory card is inserted in the card connector 10. With the memory card inserted in the card connector 10, image data processed by the image processing unit of the digital camera 1 are output through the card interface unit, the connector-side device terminals 12 and the card-side device terminals of the memory card to the memory card for storage. In this way, the image data of the digital camera 1 are stored in the memory card.

The memory card used in the card system is not limited to any specific type, so various types of memory cards including Compact Flash card (CF card), memory stick and Personal Computer card (PC card) can be used in the card system. Only one limitation is that the memory card must be insertable into the same card connector into which the above mentioned wireless communication card is insertable. The card-side device terminals (not shown) of the memory card have the same construction as the card-side device terminals 22 of the wireless communication card 20.

In the card system for the digital camera 1, which is constructed as described above, when the wireless communication card 20 is inserted through the card-insertion slot 2*a* into the card connector 10 of the camera body 2, the card-side device terminals 22 of the wireless communication card 20 are connected electrically with the connector-side device terminals 12 of the card connector 10. With the wireless communication card 20 set in the card connector 10, also the card-side antenna terminal 23 of the wireless communication card 20 is connected electrically with the connector-side antenna terminal 13, and the card-side ground terminal 24 of the wireless communication card 20 is connected electrically with the connector-side ground terminal 14 of the card connector 10.

It is preferable that the wireless communication card 20 be internalized in the digital camera 1 while it is set in the card connector 10. By designing the card system in such a way, the insertion of the wireless communication card 20 will never result in a disfigurement to the external appearance of the digital camera 1 or in an obstruction to the operation of the digital camera 1.

By the way, the image of an object formed by the lens tube 3 is detected by a Charge-Coupled Device (CCD), which is provided in the camera but not shown in the drawings. The image signals output from the CCD is then processed by the image processing unit into image data, which are sent through the card interface unit (not shown), the connector-side device terminals 12 and card-side device terminals 22 to the wireless communication card 20. There, the image data is modulated by the communication control unit (not shown) of the wireless communication card 20 and then sent through the card-side antenna terminal 23 and the connector-side antenna terminal 13 to the antenna unit 30, where the data are transmitted wirelessly to an external device (not shown), for example, to a printer.

According to the present invention, image data obtained by the digital camera 1 are sent (by the wireless communication card 20) through the antenna unit 30, which is provided in the digital camera 1. This arrangement enables the device to acquire a function of wireless data communication without disfiguring the external appearance of the device. Furthermore, the system can be so designed that the digital camera 1 can be operated remotely with a remote controller, whose operation signals are directed wirelessly to the antenna unit 30.

In a case where a memory card (not shown) is set in the card connector 10, image data processed by the image processing unit are sent through the card interface unit and the card connector 10 to the memory card for storage.

According to the card system, which is described above, with the wireless communication card 20 set in the card connector 10, the data of the digital camera 1 are sent (by the wireless communication card 20) through the antenna unit 30, which is provided in the digital camera 1. In this way, this system enables the digital camera 1 to acquire a function of wireless data communication without disfiguring the external appearance of the digital camera 1 and without impairing the operability of the digital camera 1.

Furthermore, by constructing the card system to internalize the wireless communication card 20, which is inserted into the card connector 10, in the digital camera 1, disfigurement to the external appearance of the digital camera 1 as well as impairment to the operability of the digital camera 1 are avoided completely.

In the card system, the card-side device terminals 22 are provided in the front end of the wireless communication card 20 in the insertion direction, and the connector-side device terminals 12 are provided in the surface of the card connector 10 that faces the card-side device terminals 22. This design enables the addition of the connector-side antenna terminal 13 and the card-side antenna terminal 23 in respective side surfaces of the card connector 10 and the wireless communication card 20 without any rearrangement of the connector-side device terminals 12 and the card-side device terminals 22, which are arranged according to the prior art.

Because the system is constructed to enable use of a memory card, data in the digital camera 1 can be stored in the memory card, which is inserted in the card connector 10.

In the above described embodiment, the connector-side antenna terminal 13 and the card-side antenna terminal 23 are provided in one side surfaces of the card connector 10 and the wireless communication card 20, respectively. However, the present invention is not limited to this arrangement.

Figure 3:
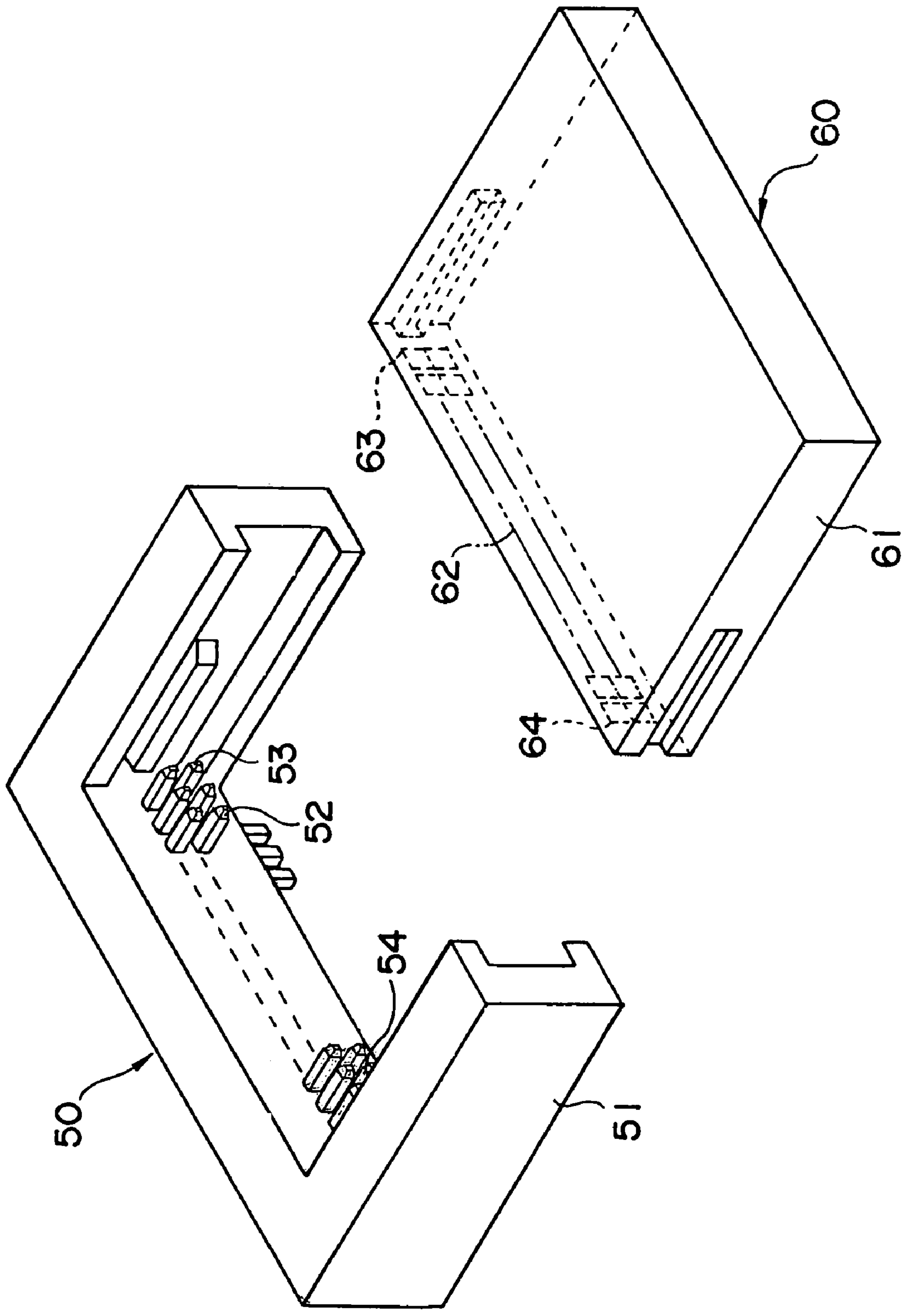
FIG. 3 is a perspective view of another card system, which is presented as an example of modification.

For example, as shown in FIG. 3, a connector-side antenna terminal 53 and a connector-side ground terminal 54 may be provided, respectively, at either side end of the rows of connector-side device terminals 52, which are provided in plurality in the connector body 51 of a card connector 50. In this case, accordingly, a card-side antenna terminal 63 and a card-side ground terminal 64 are provided, respectively, at either side end of the rows of card-side device terminals 62, which are provided in plurality in the card body 61 of a wireless communication card 60. In this embodiment, the parts of the connector-side device terminals 52 located at the lateral ends are used as the connector-side antenna terminal 53 and the connector-side ground terminal 54 while the parts of the card-side device terminals 62 located at the lateral ends are used as the card-side antenna terminal 63 and the card-side ground terminal 64. This embodiment achieves an equivalent effect as the above described embodiment of the card system while it effectively uses the connector-side device terminals and the card-side device terminals.

Figure 4:
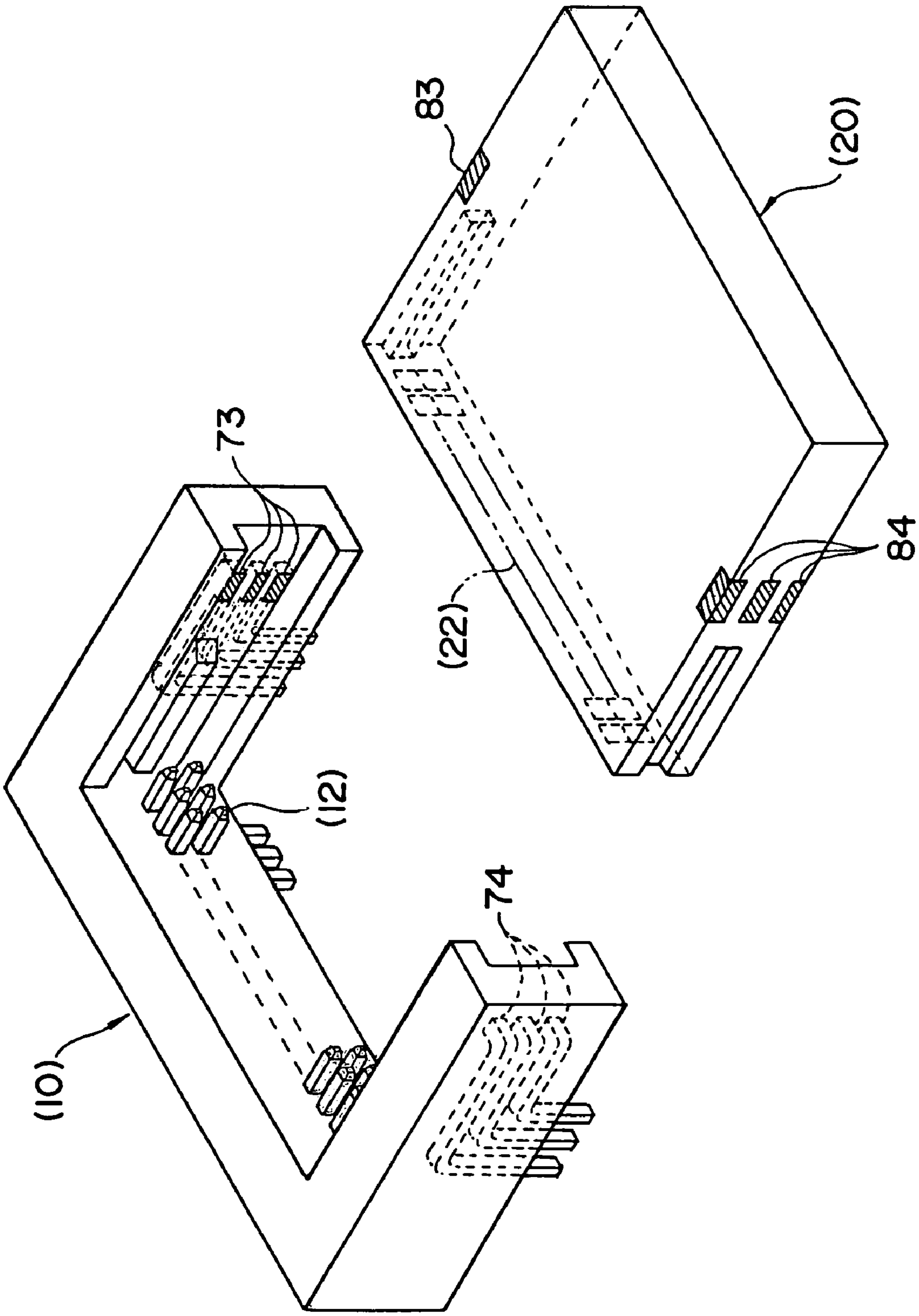
FIG. 4 is a perspective view of yet another card system, which is presented as an example of modification.
Figure 5:
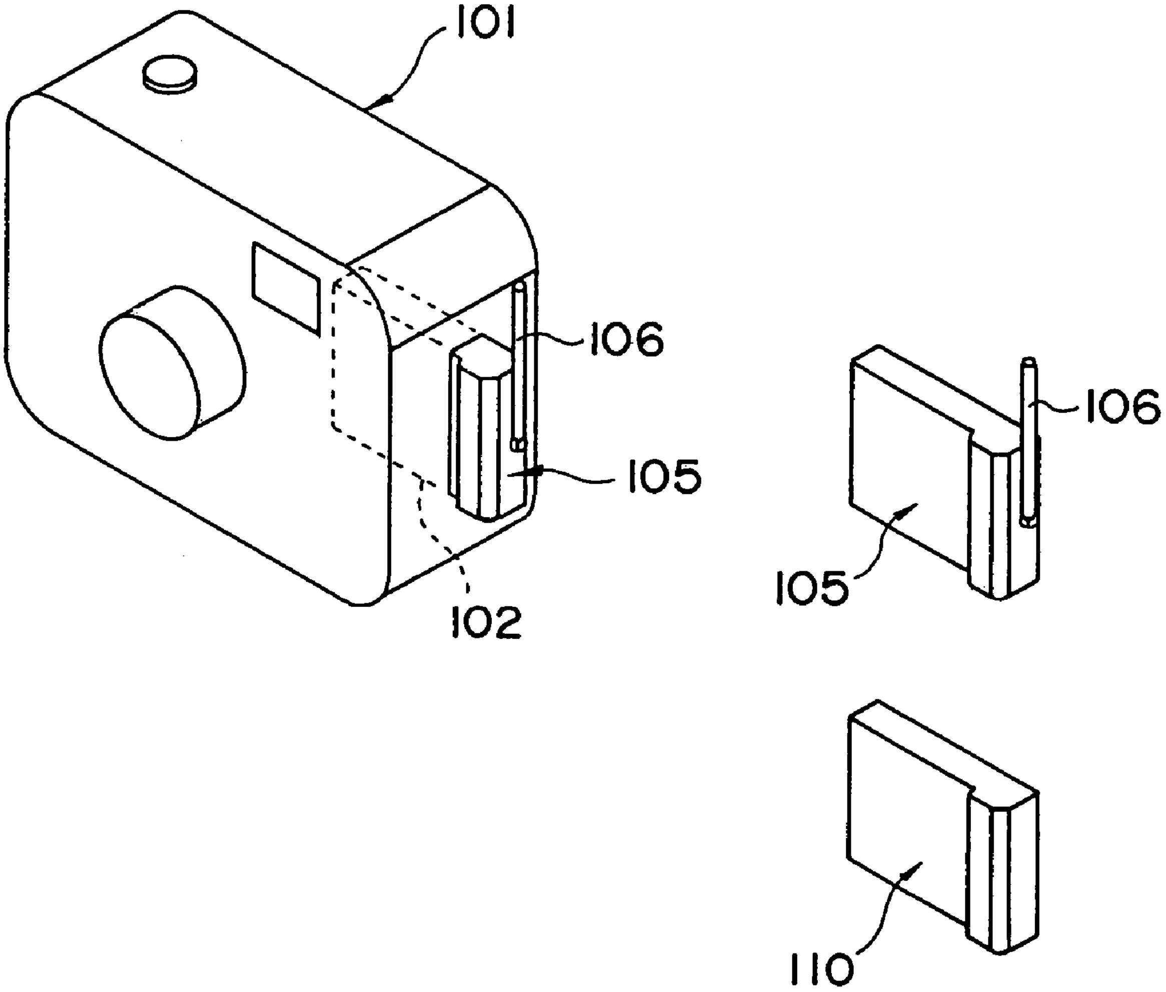
FIG. 5 is a perspective view describing how an antenna-equipped card is inserted into a digital camera.

In the above described embodiment, the connector-side antenna terminal 13 and the card-side antenna terminal 23 as well as the connector-side ground terminal 14 and the card-side ground terminal 24 are provided as surface-contact type terminals. However, the present invention is not limited to this design. For example, as shown in FIG. 4, the connector-side antenna terminal 73, the card-side antenna terminal 83, the connector-side ground terminal 74 and the card-side ground terminal 84 may be provided as multipolar terminals. This design presents an expectation that a wireless communication be realized at a bandwidth of 1.2~2.4 GHz.

Furthermore, in the above described embodiment, the digital camera 1 is described as an electronic device equipped with a card system according to the present invention. However, the present invention is not limited to a digital camera, and it can be applied to other electronic devices which are equipped with a function of wireless communication, for example, personal computers, PDAs and Electronic Toll Collection systems (ETC).

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A card system comprising:

an electronic device, the electronic device including a U-shaped card connector with opposing channels and an antenna; and a removable card for controlling wireless data communication between the electronic device and an external device through the antenna, the removable card being insertable into the card connector so that it is completely internalized in the electronic device, wherein the card connector includes connector-side terminals for electrical connection to the removable card, and the opposing channels include an antenna terminal and a ground terminal.

2. The card system according to claim 1, wherein the removable card includes an antenna terminal and a ground terminal.

3. A removable card for wireless communication for use in the card system of claim 1, wherein the removable card includes an antenna terminal.

4. A memory card for use in the card system according to claim 1, wherein the removable card includes an antenna terminal and a ground terminal.

5. The card system according to claim 1, wherein the card connector is configured to connect with a memory card.

6. The card system according to claim 5, wherein the memory card includes card-side device terminals for connection to the connector-side terminals.

7. The card system as set forth in claim 3, wherein the removable card for wireless communication is internalized in said electronic device when the removable card for wireless communication is inserted into the card connector.

8. The card system as set forth in claim 7, wherein the removable card comprises card-side device terminals provided in a front end of the removable card in a direction of insertion, and the connector-side device terminals are provided in a surface of the card connector that faces the card-side device terminals.

9. The card system as set forth in claim 1, wherein:

the card connector is configured to accept a memory card;

the memory card comprises card-side device terminals, which are electrically connected with the connector-side device terminals when the memory card is inserted in the card connector; and when the memory card is inserted in the card connector, data communication can be established between the electronic device and the memory card through the connector-side device terminals and the card-side device terminals of the memory card.

* * * * *